United States Patent [19]

Houston

[11] 4,390,839
[45] Jun. 28, 1983

[54] METHOD AND APPARATUS FOR TONE CONTROLLED VARIABLE SENSITIVITY TIME-OF-DAY WATT-HOUR METERING

[75] Inventor: John M. Houston, Schenectady, N.Y.

[73] Assignee: General Electric Company, Schenectady, N.Y.

[21] Appl. No.: 192,451

[22] Filed: Sep. 30, 1980

[51] Int. Cl.³ .......................... G01R 15/08; H04B 3/54
[52] U.S. Cl. .................................... 324/116; 307/140; 340/310 A
[58] Field of Search ................ 324/116; 361/182, 184; 307/140; 340/310 R, 310 A

[56] References Cited

U.S. PATENT DOCUMENTS

| | | |
|---|---|---|
| 706,575 | 8/1902 | Lunt . |
| 1,082,148 | 12/1913 | Burke . |
| 1,138,513 | 5/1915 | Stempel . |
| 1,996,145 | 4/1935 | Chirol . |
| 2,415,653 | 2/1947 | Ogurkowski . |
| 3,683,343 | 8/1972 | Feldman et al. . |
| 4,082,999 | 4/1978 | Staker ................... 324/116 |
| 4,206,405 | 6/1980 | Pentecost ............. 324/116 |

*Primary Examiner*—Ernest F. Karlsen
*Attorney, Agent, or Firm*—Lawrence D. Cutter; James C. Davis, Jr.; Marvin Snyder

[57] ABSTRACT

A time-of-day watt-hour meter shifts sensitivity whenever the utility transmits an audio tone over the power line to the watt-hour meter. Via an integrated circuit receiver, the tone causes a solid state switch to close, thus increasing the meter sensitivity by increasing the effective number of turns of a voltage coil across the 240 volt line. The effective sensitivity of the meter can be adjusted as desired by varying the duty cycle of the tone transmitted over the power line.

20 Claims, 3 Drawing Figures

METHOD AND APPARATUS FOR TONE CONTROLLED VARIABLE SENSITIVITY TIME-OF-DAY WATT-HOUR METERING

BACKGROUND OF THE INVENTION

The instant invention relates to time-of-day watt-hour meters, and, more particularly, to a time-of-day watt-hour meter having a variable sensitivity controlled from a central control station.

The energy shortage has caused greatly increased interest by electric utilities in "time-of-day" metering, i.e., charging the customer a higher rate per kilowatt-hour during predetermined and announced daily periods of peak energy use. For example, for many utilities peak consumption occurs during several hours in the early evening. Time-of-day metering is attractive as an inducement to customers to use less electricity during those peak hours, which would allow the utility to save money and fuel by not having to invest in expensive and little-used peak generating capacity. The customer is given an economic incentive to operate electrical appliances at the lower cost time.

Conventional time-of-day watt-hour meters have two or more sets of read-out dials, one set which reads power consumption during the normal periods, and one (or more) set that reads power consumption during the high cost period (or periods). The switching between the sets of dials is done by an electric clock or electric timer. In some time-of-day meters this clock controls a solenoid, which shifts gears to connect the rotor of the watt-hour meter to one or the other set of output dials. Alternatively, magnetic clutches or brakes can be used to couple the induction rotor to the appropriate output registers. Other prior art time-of-day meters consist of two complete watt-hour meters in one case, each connected to its own set of dials. A timer shifts from one meter to the other by switching an electrical contact, e.g., energizing the voltage coil of one or the other meter to record the kilowatt hours used during the specified time period.

These prior art time-of-day meters allow only two or a very limited number of separate metering periods, and when an interruption in power delivery to a customer occurs, the clock which controls the energization of the selected meters must be adjusted to correct for the period of power outage. This adds greatly to the cost of time-of-day metering in terms of both the meter itself incorporating the clock and the multiple read-outs and in personnel cost to ensure appropriate settings of the necessary clocks. Another limitation of conventional time-of-day meters is that they lack flexibility, i.e., the electric utility may wish to shift the "high-cost" hours to accommodate differences in summer/winter peaks or to omit weekends and holidays. Also, the annual shift to daylight-savings hours complicates time-of-day metering. Thus, either the timer in the conventional time-of-day meter has to be very complex, or else utility personnel have to go around and reset thousands of timers at least several times a year.

SUMMARY OF THE INVENTION

An object of the instant invention is to provide a time-of-day watt-hour meter which allows for a multiplicity of time periods during which electrical power consumption can be separately recorded. A further object of the instant invention is to provide time-of-day watt-hour metering which does not require a clock to be installed in each watt-hour meter, and which requires only a single read-out register.

According to the instant invention, a time-of-day watt-hour meter comprises a rotor for driving a set of dials, at least one current coil connected in series with at least one of said power line conductors, at least one voltage coil connected between said pair of power line conductors, said rotor and coils being configured to operate as an induction motor, and means to selectively adjust the effective number of turns in said voltage coil, said means being responsive to signals bearing tone burst information present on the power line, said tone bursts being at a higher frequency than the A.C. power supplied over said conductor pair.

The instant invention includes a method for recording electrical power consumption by a time-of-day watt-hour meter having a current coil, a voltage coil and a rotor configured to operate as an induction motor by applying a tone burst signal at frequency above said power line frequency of a power line whose power consumption is to be measured; receiving said signal by a time-of-day watt-hour meter; changing the effective number of turns of a voltage coil connected between a pair of power line conductors responsive to said tone burst signal.

BRIEF DESCRIPTION OF THE DRAWINGS

The features of the invention believed to be novel and unobvious over the prior art are set forth with particularity in the appended claims. The invention itself, however, as to organization, method of operation and advantages thereof, may best be understood by reference to the following description taken in conjunction with the accompanying drawings in which:

DESCRIPTION OF THE PREFERRED EMBODIMENTS

A typical watt-hour meter is an induction motor having a rotor consisting of a flat aluminum disk. Two low resistance current coils are located adjacent the rotor, the coil being in series, respectively, with each of the two 120 volt lines entering the house. Currents of many amperes flow through these coils when heavy loads are drawn by the house. A high inductance voltage coil is also adjacent the rotor, and is connected between the 120 volt lines, i.e., the voltage coil has approximately 240 volts A.C. across it. Because of the high inductance, the voltage coil draws only a small current (e.g., a few milliamperes) which is proportional to the voltage. When the load on the meter is purely resistive, then the current in the voltage coil is 90° out of phase with the current in the current coils because of the voltage coil inductance. Hence, a rotating magnetic field is created which drives the aluminum rotor as in any induction motor. When the meter load is a pure reactance, then there is no phase difference and no rotating field. In this manner, the watt-hour meter responds to phase angle as well as the product of current and voltage.

Figure 1:
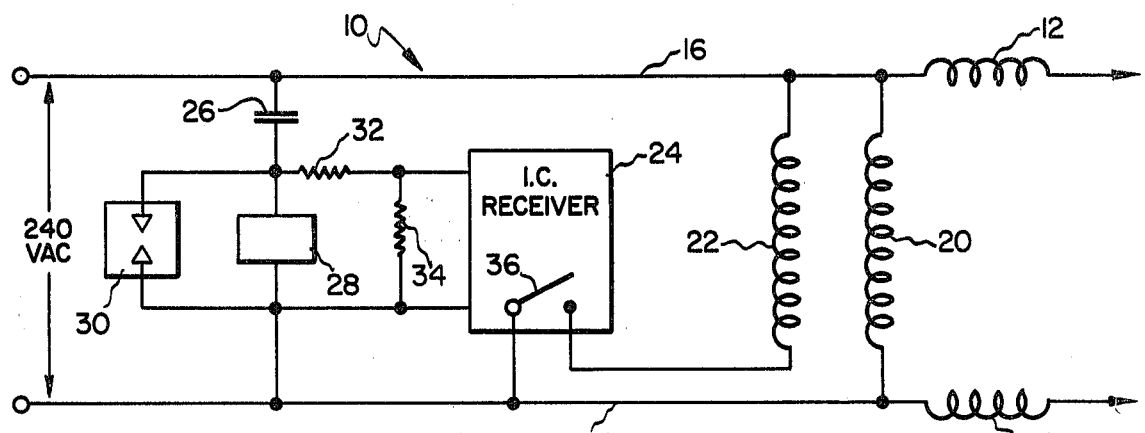
FIG. 1 illustrates schematically a time-of-day watt-hour meter designed according to the instant invention.

A watt-hour meter designed according to the instant invention is illustrated schematically in FIG. 1. The meter 10 is connected to a typical power delivery line having typically 240 volt A.C. power applied thereto from a power source (not shown). The meter 10 comprises a pair of current coils 12, 14 each connected in series with one line 16, 18, respectively, of the power delivery system, and a pair of voltage coils 20, 22 connected between the power line conductors. Meter 10 further includes a rotor (not shown) configured such that the coils and rotor operate as an induction motor. It is noted that only one of the coils 12 and 14 is required to be employed within the watt-hour meter, although both are typically used.

In one embodiment of my instant invention, an extra voltage coil 22 and integrated circuit receiver 24 have been added to a conventional single-phase watt-hour meter. The second voltage coil 22 is switched in by the output of a small integrated circuit receiver 24 including solid state switch 36. The switching can be done by a pair of transistors built into the integrated circuit, or by two small external transistors or SCRs. The voltage drop across switch 36 is kept small compared to 240 volts A.C. so as not to cause meter accuracy to be strongly dependent upon the voltage drop across switch 36. The switch 36 is controlled by a circuit connected across the power lines which includes a capacitor 27, a zener diode 28 and a spark gap 30 in parallel with a series combination of resistors 32, 34 to control current flow in the I.C. receiver 24. It is necessary to protect the integrated circuit receiver from voltage spikes on the line, e.g., those caused by lightning. Spark gap 30 plus a small zener diode across the input of the I.C. receiver would conduct only on voltage surges, e.g., those caused by lightning, to protect the I.C. receiver 24 from voltage spikes. It is noted that a metal oxide varistor may be substituted for the zener diode.

The I.C. receiver 24 is a narrow band audio amplifier, i.e., when a tone is received, the solid state switch 36 at the output of the receiver closes, thus energizing the second voltage coil 22. The design of a narrow band integrated circuit audio amplifier is well-known to those skilled in the art. The bandwidth chosen will depend upon the tone frequency to be used. At low frequencies (e.g., 570 Hz), a bandwidth of ±20 Hz would be reasonable, since that would yield about 0.05 second rise time (and decay) on the tone bursts, and yet not receive 60 Hz harmonics at 540 and 600 Hz. At higher frequency (e.g., 10 K Hz), where 60 Hz harmonics are not a problem, a wider bandwidth could be used in order to raise the frequency tolerances on the I.C. receiver. It is noted that a small rise time (and decay time) on the tone burst caused by the bandwidth of the I.C. receiver causes no error as long as all the receivers behave in the same way, i.e., one would measure the curve of meter sensitivity versus transmitter duty cycle, and the utility would then use this curve in deciding what duty cycle to transmit during any one rate period. All of these duty cycles and times would, of course, be incorporated into a master timer located at the transmitter, and it would automatically cycle on day after day until changed.

The embodiment of FIG. 1 operates as follows. When the meter is to record at the "normal" rate, no signal is transmitted over power lines 16, 18 and only voltage coil 20 is energized to cause the meter to turn at a predetermined rate. When a change in meter sensitivity is desired, an audio tone is transmitted over the power line to the integrated circuit receiver 24. The tone signal causes the integrated circuit receiver to close solid state switch 36 and energize the second voltage coil 22, which changes the sensitivity of the meter, i.e., the rate at which the rotor turns for a given current flow rate in lines 16 and 18. If the tone is transmitted continuously over the power line, the time-of-day meter will record at the increased sensitivity rate caused by the energization fo both voltage coils 20, 22. Thus, voltage coils 20, 22 could be selected so that during the period that a tone signal is received by the integrated circuit receiver the sensitivity of the watt-hour meter is some multiple of the "normal" sensitivity (e.g., 2-5 times normal sensitivity).

Figure 3:
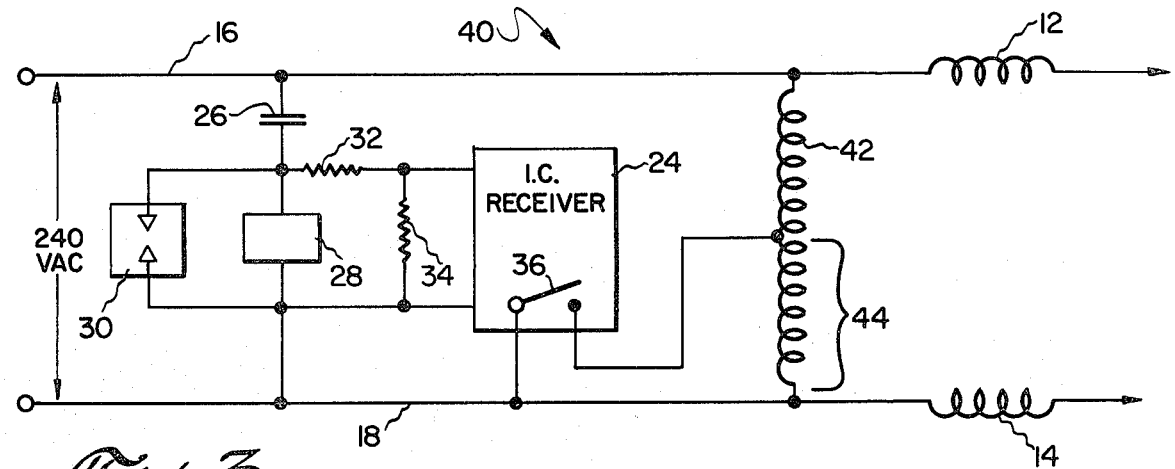
FIG. 3 illustrates schematically an alternative embodiment of the time-of-day watt-hour meter of the instant invention.

An alternative embodiment of my instant invention is shown in FIG. 3. The embodiment of FIG. 3 includes a meter 40 having a single tapped voltage coil 42 connected to the solid state switch 36 in I.C. receiver 26, so that when a signal is received from the generating station, the portion 44 of the tapped voltage coil 42 is shorted out to change the meter sensitivity.

The time-of-day watt-hour meter 40 operates as follows. The integrated circuit receiver 26 receives a tone transmitted over the power line from one or more central sites in each city, e.g., from a power station or substation and closes solid state switch 36 to short out portion 44 of coil 42 to increase the current flow through the remainder of coil 42 to thereby increase meter sensitivity, i.e., accelerate the rotational speed of the rotor of the watt-hour meter to again record "weighted" watt-hours. The change in sensitivity will be inversely proportional to the reduction in number of turns shorted, i.e., shorting half the turns doubles the meter sensitivity.

Figure 2:
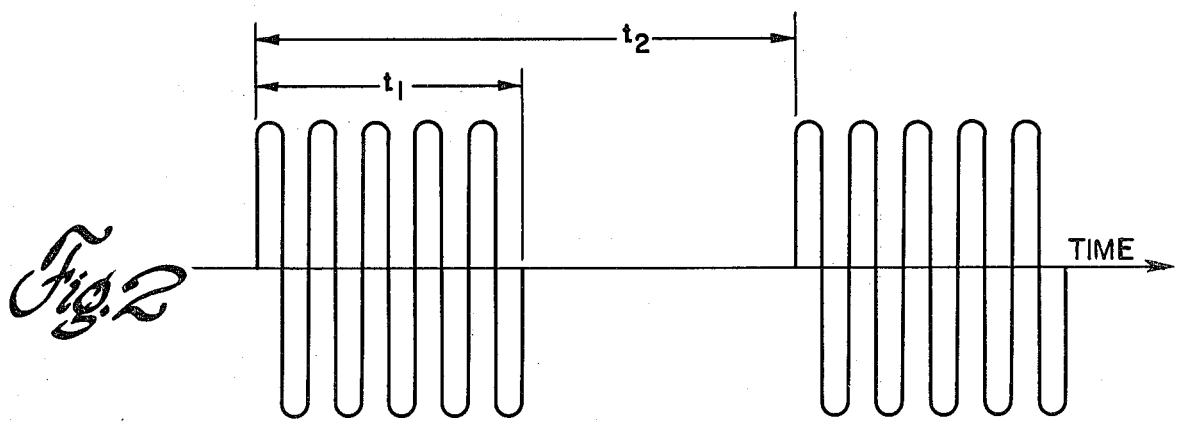
FIG. 2 illustrates a typical tone signal employed in controlling the time-of-day watt-hour meter of the instant invention.

In order to obtain intermediate sensitivities for either embodiment of my invention, the tone transmitter is turned on and off as shown in FIG. 2. For example, the tone might by cycled on, $t_1$, for one second and off, $t_2-t_1$, for two seconds. The sensitivity would be adjusted by varying the duty cycle of the tone, i.e., the ratio of $t_1$ to $t_2$ in FIG. 2. As the tone duty cycle is varied, the meter average sensitivity would smoothly vary from a minimum (i.e., duty cycle=zero, only voltage coil 20 energized) to a maximum (duty cycle=100%, both coils are energized). By varying the meter sensitivity in this manner, the utility could divide the day into several periods and charge a different rate during each period. Note that this results in the watt-hour meter not registering simple watt-hours, but instead, "weighted" kilowatt-hours, i.e., the watt-hour meter turns at a faster rate during the preselected "high cost" periods, during which some multiple of actual watt-hours used would be recorded. By varying the relative length of the time periods $t_1$ and $t_2$ shown in FIG. 2, essentially any meter sensitivity, i.e., multiple of watt-hours, can be obtained. My present invention provides the "fail-safe" feature that if no tone is received by a particular watt-hour meter, or if a tone receiver fails, the customer is charged the lowest rate all the time, i.e., the customer merely avoids paying the premium normally charged at higher cost periods.

Tones in the range of 3,000 to 15,000 Hz, and preferably in the range of 3,000 to 10,000 Hz, would be most suitable, since those frequencies are high enough that the amplitude of 60 Hz harmonics is low enough to be easily overridden. However, lower frequencies can also be used, provided that one is careful to operate at a frequency between the 60 Hz harmonics. If one assumes that the tone bursts see the same impedance as the 60 Hz power on a transmission line, one can then readily calculate the tone signal available at a typical watt-meter socket. For example, if the utility were distributing 1,000 Megawatts of 60 Hz power at 240 volts A.C., and used a 100 watt tone transmitter, the tone voltage at a typical watt-meter socket would be approximately $$V = \frac{240}{\sqrt{10^7}} = 76 \text{ millivolts.}$$

This is an adequate signal to operate a solid state receiver. In an actual system one would incorporate long time constant automatic gain control in the receiver, so that the system would work over a wide range of tone signal levels.

To overcome any noise problem, two tones could be simultaneously transmitted. Two integrated circuit receivers (probably both on a single chip) would receive the tones and close the solid state switch only when both tones were being simultaneously received. Alternatively, a frequency shift in the tone transmitted could be used to control the watt-hour meter rather than a simple on-off signal from the tone transmitter. Another variation is to put the modulated tone (e.g., 570 Hz) on a much higher frequency continuous carrier (e.g., 10 K Hz). The integrated circuit receiver would then be tuned to 10 K Hz, and the modulation removed after amplification. This arrangement would have noise advantages.

Yet another variation of my instant invention incorporates a small 60 Hz counter on the integrated circuit chip used for the tone receiver. When a tone burst is received by the tone receiver, the tone receiver would turn on the 60 Hz counter, which, starting at the first 60 Hz voltage zero, would close the solid state switch (thus energizing voltage coil 22, FIG. 1) for an integral number of 60 Hz cycles, where the integer might typically be in a range 32 to 28. Then the solid state switch would open and the system would wait for the next tone burst. Such a system has the advantage that the duty cycle of the watt-hour meter is then dependent only on the number of tone bursts sent per minute, i.e., is independent of the length of the tone burst or the characteristics of the I.C. receiver. Also, the I.C. receiver can then have a rather narrow bandwidth, since it doesn't matter if a fraction of a second elapses before the tone output appears at the output of the I.C. receiver. Dependence upon the accuracy of 60 Hz power frequency could be eliminated by having the master time set the duty cycle by counting a preset number of 60 Hz cycles, i.e., the tone is turned on for $N_1$ 60 Hz cycles and off for $N_2$ cycles, where $N_1$ and $N_2$ are integers. Then, for example, if the 60 Hz frequency is low, the on and off periods will increase by the same ratio at both the master timer and the I.C. receiver, thus causing no change in watt-meter average sensitivity.

My instant invention provides a practical time-of-day watt-hour meter which requires no multiple registers, gear shifts, clutches, complex timers or batteries. Further, no resetting of a timer or other device at each time-of-day meter is required to change the schedule of "rate periods". Also, when a new meter is installed, no time resetting is required as part of the installation. Only a single timer at the central station has to be reset when a change in the metering rate for a particular time is required. My invention can easily adapt to changes in kilowatt hour multipliers charged during peak hours. Flexibility is provided by simply adjusting or readjusting the tone signal being transmitted from the master timer to each of the individually-installed time-of-day watt-hour meters. Further, the meter may be read by reading only a single register rather than multiple registers used in some prior art time-of-day meters, significantly reducing labor costs both in reading and typing the data into the utility computer. This significantly reduces the probability of errors. Therefore, it will be appreciated that my present invention provides a significant advance in the art of time-of-day metering of electric power usage.

I claim:

1. A time-of-day watt-hour meter for measuring energy supplied over a pair of alternating current power line conductors comprising:
   a rotor for driving a set of dials;
   at least one current coil connected in series with at least one of said power line conductors;
   at least one voltage coil connected between said pair of power line conductors, said rotor and coils being configured to operate as an induction motor; and
   means for selectively adjusting the sensitivity of said voltage coil for a predetermined portion of a predetermined time interval to cause said rotor to rotate at a faster rate during the time during which said signals bearing tone burst information are received than during the time during which no such signals are received, said means being responsive to signals bearing tone burst information at a predetermined frequency present on said power line, said tone burst frequency being higher than the A.C. power delivery frequency supplied over the conductor pair.

2. The apparatus of claim 1 wherein said means to selectively adjust the sensitivity of said voltage coil comprises an integrated circuit receiver including a solid state electronic cut-off switch and a narrow band amplifier tuned approximately to the frequency of the tone in said tone burst; said amplifier being connected between said power line conductors, the output of said amplifier being employed to trigger said electronic cut-off switch to control the effective number of turns in said voltage coil.

3. The apparatus of claim 2 wherein said predetermined time interval is in the range of 1–5 seconds; and wherein each of a pair of current coils is connected, respectively, in series with each of said power line conductors.

4. The apparatus of claim 2 wherein said means for selectively adjusting the effective number of turns comprises means for increasing the effective number of turns in said voltage coil for a predetermined number of cycles of a 60 Hz power delivery signal.

5. The apparatus of claim 4 wherein:
   said at least one voltage coil comprises a pair of voltage coils connected between said pair of power line conductors; and
   said switch comprises means for alternately connecting and disconnecting one of said coils in parallel with the other of said voltage coils.

6. The apparatus of claim 2 wherein said means for selectively adjusting the effective number of turns comprises means for increasing the effective number of turns in said voltage coil responsive to a modulated tone on a high frequency continuous carrier signal.

7. The apparatus of claim 2 wherein said means for selectively adjusting the effective number of turns comprises means for increasing the effective number of turns in said voltage coil responsive to a frequency shift in said tone burst signal.

8. The apparatus of claim 1 wherein:
said means to selectively adjust the sensitivity of said voltage coil comprises an integrated circuit receiver including a solid state electronic cut-off switch and a narrow band amplifier tuned approximately to the frequency of the tone in said tone burst; said amplifier being connected between said power line conductors; the output of said amplifier being employed to trigger said electronic cut-off switch;
said voltage coil comprises a center-tapped voltage coil connected between said pair of power line conductors; and
said switch is connected to the center-tap of said voltage coil to selectively connect and disconnect a short circuit across a portion of said voltage coil in response to a tone burst being received by said receiver.

9. A method of time-of-day watt-hour metering of electric power consumption comprising the steps of:
energizing at least one current coil connected in series with one of a pair of power line conductors;
energizing at least one voltage coil connected across a pair of power line conductors, said current and voltage coils being configured with a rotor to operate as an induction motor; and
selectively adjusting the sensitivity of said voltage coil for a predetermined portion of a predetermined time interval in response to signals bearing tone bursts of information present on said power line at a higher frequency than the A.C. power supplied over said conductor pair of control the rate of rotation of said rotor.

10. The method of claim 9 wherein said step of selectively adjusting comprises:
receiving said tone bursts by an integrated circuit receiver tuned to approximately the frequency of the tone in said tone bursts; and
triggering an electronic cut-off switch to change the effective number of turns in said voltage coil in response to the signal received in said tone bursts.

11. The method of claim 10 wherein said step of selectively adjusting the effective number of turns of said voltage coil comprises changing the effective number of turns in said voltage coil for a predetermined integral number of cycles of a 60 Hz power delivery signal.

12. The method of claim 11 wherein said step of selectively adjusting the effective number of turns of said voltage coil comprises alternately connecting and disconnecting a short circuit connected across a portion of one said voltage coil.

13. The method of claim 11 wherein said step of selectively adjusting the effective number of turns of said voltage coil comprises alternately connecting and disconnecting one of a pair of voltage coils connected in parallel between said pair of power line conductors.

14. The method of claim 10 wherein said step of selectively adjusting the effective number of turns of said voltage coil comprises changing the effective number of turns in said voltage coil during the duration of a tone burst received by said integrated circuit receiver comprising a modulated tone imposed upon a higher frequency continuous carrier signal.

15. The method of claim 14 wherein said step of selectively adjusting the number of turns of said voltage coil comprises alternately connecting and disconnecting a short circuit connected across a portion of one said voltage coil.

16. The method of claim 14 wherein said step of selectively adjusting the number of turns of said voltage coil comprises alternately connecting and disconnecting one of a pair of voltage coils connected in parallel between said pair of power line conductors.

17. The method of claim 10 wherein said step of selectively adjusting the effective number of turns of said voltage coil comprises increasing the effective number of turns in said voltage coil responsive to a frequency shift in a tone burst received by said integrated circuit receiver.

18. The method of claim 10 wherein said step of selectively adjusting the number of turns of said voltage coil comprises changing the effective number of turns in said voltage coil responsive to the integrated circuit receiver receiving of a tone burst comprising a signal incorporating two tone signals.

19. The method of claim 18 wherein said step of selectively adjusting the number of turns of said voltage coil comprises alternately connecting and disconnecting a short circuit connected across a portion of one said voltage coil.

20. The method of claim 18 wherein said step of selectively adjusting the number of turns of said voltage coil comprises alternately connecting and disconnecting one of a pair of voltage coils connected in parallel between said pair of power line conductors.

* * * * *